(12) United States Patent
Yoo

(10) Patent No.: US 9,736,605 B2
(45) Date of Patent: *Aug. 15, 2017

(54) METHOD OF MANUFACTURING MICROPHONE, MICROPHONE, AND CONTROL METHOD THEREFOR

(71) Applicant: HYUNDAI MOTOR COMPANY, Seoul (KR)

(72) Inventor: Ilseon Yoo, Seoul (KR)

(73) Assignee: Hyundai Motor Company, Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/852,310

(22) Filed: Sep. 11, 2015

(65) Prior Publication Data
US 2016/0150319 A1    May 26, 2016

(30) Foreign Application Priority Data

Nov. 26, 2014 (KR) .......................... 10-2014-0166786

(51) Int. Cl.
*H04R 31/00* (2006.01)
*H04R 19/00* (2006.01)
(Continued)

(52) U.S. Cl.
CPC ............... *H04R 31/00* (2013.01); *B81B 3/00* (2013.01); *H04R 1/342* (2013.01); *H04R 19/005* (2013.01);
(Continued)

(58) Field of Classification Search
CPC ........... H04R 3/00; H04R 3/06; H04R 19/005
USPC ....... 56/249; 367/153, 181; 381/86, 92, 369, 381/399, 174, 175, 313, 355; 73/715; 257/74, 254, 416; 438/53
See application file for complete search history.

(56) References Cited

U.S. PATENT DOCUMENTS 3,700,938 A * 10/1972 Bryant .................... H04R 7/22
310/324
4,502,322 A * 3/1985 Tero ........................ G01M 3/24
122/504
(Continued)

FOREIGN PATENT DOCUMENTS

JP    2000-287292 A    10/2000
KR   10-2006-0056010 A   5/2006
(Continued)

*Primary Examiner* — Gerald Gauthier
(74) *Attorney, Agent, or Firm* — McDermott Will & Emery LLP

(57) ABSTRACT

Disclosed are a method of manufacturing a microphone, a microphone, and a control method thereof. The method includes forming a sound sensing module on a main substrate including a first sound aperture such that the sound sensing module is connected to the first sound aperture. The method further include forming a cover for receiving the sound sensing module formed therein with a second sound aperture corresponding to the first sound aperture on the main substrate. The method also includes forming a sound delay filter at a receiving space of the cover to be connected to the second sound aperture. The method also includes forming a semiconductor chip electrically connected to the sound sensing module at the receiving space, to selectively operate the sound delay filter according to a signal output from the sound sensing module.

13 Claims, 6 Drawing Sheets

(51) Int. Cl.
*H04R 19/04* (2006.01)
*B81B 3/00* (2006.01)
*H04R 1/34* (2006.01)
*H04R 29/00* (2006.01)
*H04R 1/38* (2006.01)

(52) U.S. Cl.
CPC ........... *H04R 19/04* (2013.01); *H04R 29/004* (2013.01); *H04R 1/38* (2013.01); *H04R 2499/11* (2013.01); *H04R 2499/13* (2013.01)

(56) References Cited

U.S. PATENT DOCUMENTS

| | | | | |
|---|---|---|---|---|
| 4,866,682 A * | 9/1989 | Uchihashi | ............ | B06B 1/0633 310/337 |
| 5,490,220 A * | 2/1996 | Loeppert | ............... | B81B 3/0072 381/113 |
| 6,285,771 B1 * | 9/2001 | Killion | .................. | H04R 1/406 381/313 |
| 7,146,016 B2 * | 12/2006 | Pedersen | ............... | B81B 3/0072 381/113 |
| 7,951,636 B2 * | 5/2011 | Lee | .................... | B81C 1/00182 257/254 |
| 8,059,842 B2 * | 11/2011 | Suzuki | .................. | H04R 19/04 381/173 |
| 8,263,426 B2 * | 9/2012 | Ko | ........................ | G01H 11/06 257/415 |
| 8,368,153 B2 * | 2/2013 | Huang | ................. | B81B 7/0061 257/414 |
| 8,464,589 B2 * | 6/2013 | Lee | ...................... | B81B 3/0072 361/283.1 |
| 8,704,238 B2 * | 4/2014 | Yang | .................. | B81C 1/00246 257/459 |
| 8,796,746 B2 * | 8/2014 | Yang | .................. | B81C 1/00246 257/254 |
| 8,828,773 B2 * | 9/2014 | Weigold | ............. | B81C 1/00944 257/E21.002 |
| 9,066,189 B2 * | 6/2015 | Einberger | ............ | H04R 25/606 |
| 9,380,391 B2 * | 6/2016 | Yoo | ........................ | H04R 17/02 |
| 9,403,670 B2 * | 8/2016 | Schelling | ............. | B81B 3/0059 |
| 2002/0067663 A1 * | 6/2002 | Loeppert | ............... | B81B 3/0072 367/181 |
| 2002/0110256 A1 * | 8/2002 | Watson | .................... | B60R 1/12 381/389 |
| 2006/0233401 A1 | 10/2006 | Wang | | |
| 2007/0223773 A1 * | 9/2007 | Tripp | ...................... | H04R 1/06 381/399 |
| 2008/0083205 A1 * | 4/2008 | Berkeley | ............. | A01D 34/62 56/249 |
| 2009/0097674 A1 * | 4/2009 | Watson | .................... | B60R 1/12 381/86 |
| 2011/0299701 A1 * | 12/2011 | Karunasiri | ............ | H04R 3/00 381/92 |
| 2016/0150319 A1 * | 5/2016 | Yoo | ......................... | H04R 3/06 381/92 |
| 2016/0150326 A1 * | 5/2016 | Yoo | ........................ | H04R 31/00 381/174 |
| 2016/0157011 A1 * | 6/2016 | Yoo | .......................... | H04R 3/00 381/357 |
| 2016/0157012 A1 * | 6/2016 | Yoo | ........................ | H04R 31/00 381/369 |
| 2017/0064459 A1 * | 3/2017 | Yoo | ...................... | H04R 17/005 |
| 2017/0094405 A1 * | 3/2017 | Yoo | ........................ | H04R 1/326 |

FOREIGN PATENT DOCUMENTS

| | | |
|---|---|---|
| KR | 10-0631285 B1 | 10/2006 |
| KR | 10-0640199 B1 | 11/2006 |
| KR | 10-2007-0031512 A | 3/2007 |
| KR | 10-0740462 B1 | 7/2007 |
| KR | 10-2014-0140292 A | 12/2014 |

* cited by examiner

METHOD OF MANUFACTURING MICROPHONE, MICROPHONE, AND CONTROL METHOD THEREFOR

CROSS-REFERENCE TO RELATED APPLICATION

This application claims priority to and the benefit of Korean Patent Application No. 1 0-201 4-01 66786 filed in the Korean Intellectual Property Office on Nov. 26, 2014, the entire contents of which are incorporated herein by reference.

TECHNICAL FIELD

The present disclosure relates to a method of manufacturing a microphone, a microphone, and a control method thereof. More particularly, the present disclosure relates to a method of manufacturing a microphone capable of selectively implementing a direction characteristic of the microphone according to a noise environment, a microphone, and a control method thereof.

BACKGROUND

In general, a microphone is a device used to convert a sound into an electrical signal. The microphone is applicable to various communication devices such as a mobile communication device such as a terminal, an ear phone, or a hearing aid. Such a microphone requires excellent sound performance, reliability, and operability.

A capacitive microphone based on Micro-Electro-Mechanical Systems (MEMS) technology (hereinafter referred to as 'MEMS microphone') represents excellent sound performance, reliability, and operability compared to a conventional Electret Condenser Microphone (hereinafter referred to as 'ECM microphone')

Such MEMS microphones are classified into non-directional (all directions) microphones and directional microphones, according to a directional characteristic.

A non-directional microphone is a microphone having the same sensitivity in all directions with respect to an incident sound wave. A directional microphone is a microphone where sensitivity is changed according to a direction of an incident sound wave. Directional microphones are further classified into single directional microphones and bi-directional microphones.

For example, a directional microphone is used when a recoding operation is performed in a narrow room or a user receives only desired sound in a room with reverberation.

When a microphone as described above is applied to a vehicle, since a sound source is distant and noise is changeably generated in the vehicle environment, a microphone that is robust to variation in noise environment in the vehicle is needed. In order to implement this, a directional MEMS microphone for receiving a sound source in only a desired direction can be applied.

Since a directional microphone, according to the related art as described above, may receive a sound source in only the desired direction, the directional microphone is advantageous to be robust to a noise input from a peripheral portion. However, a directional microphone has lower sensitivity than that of a non-directional microphone, and the frequency response characteristic is not excellent.

The above information disclosed in this Background section is only for enhancement of understanding of the background and therefore it may contain information that does not form the prior art that is already known in this country to a person of ordinary skill in the art.

SUMMARY

The present disclosure has been made in an effort to provide a method of manufacturing a microphone, a microphone, and a control method thereof having advantages of manufacturing a microphone suitable for an environment where a changeable noise is generated.

An exemplary embodiment of the present invention provides a method of manufacturing a microphone, the method including: forming a sound sensing module on a main substrate including a first sound aperture, such that the sound sensing module is connected to the first sound aperture. The method further includes forming a cover for receiving the sound sensing module formed therein with a second sound aperture corresponding to the first sound aperture on the main substrate. The method also includes forming a sound delay filter at a receiving space of the cover to be connected to the second sound aperture. The method also includes forming a semiconductor chip electrically connected to the sound sensing module at the receiving space, to selectively operate the sound delay filter according to a signal output from the sound sensing module.

Another embodiment of the present invention provides a microphone including a sound sensing module mounted on a surface of a main substrate formed therein with a first sound aperture formed at the main substrate such that the sound sensing module is connected to the first sound aperture. The microphone further includes a cover for receiving the sound sensing module formed therein with a second sound aperture corresponding to the first sound aperture on the main substrate; a sound delay filter formed at a receiving space of the cover to be connected to the second sound aperture. The microphone also includes a semiconductor chip electrically connected to the sound sensing module at the receiving space, to selectively operate the sound delay filter according to a signal output from the sound sensing module.

Yet another embodiment of the present invention provides an operating method of a microphone, including operating a sound sensing module by operating a sound processor. The method also includes transmitting a sound source generated from the sound sensing module to a semiconductor chip. The method further includes measuring amplitude of a noise voltage with respect to a noise voltage input from the semiconductor chip to compare the measured noise voltage with a reference voltage set in the semiconductor chip. The method also includes applying a current to a sound delay filter when the noise voltage is less than the reference voltage, so that a drive layer makes contact with a filter substrate to close a first plurality of penetration apertures and to implement the microphone as a non-directional microphone.

The operating method may further include, upon the comparing of the measured noise voltage with the reference voltage set in the semiconductor chip, blocking supply of the current to the sound delay filter when the noise voltage is equal to or greater than the reference voltage, so that the drive layer is spaced apart from the filter substrate by a predetermined distance to open the first plurality of penetration apertures and to implement the microphone as a directional microphone.

Various other effects may be directly or indirectly disclosed in the following description of the embodiment of the present invention. That is, various other effects may be disclosed in a detailed description to be described below according to an exemplary embodiment of the present invention.

DETAILED DESCRIPTION

Hereinafter, exemplary embodiments of the present invention will be described with reference to the accompanying drawings. However, the drawings and detailed description relate to some of various exemplary embodiments to efficiently describe characteristics of the present disclosure. Accordingly, the present disclosure is not limited to the following drawings and description.

In the following description, if detailed description about well-known functions or configurations may make the subject matter of the disclosure unclear, the detailed description thereof will be omitted. The terms are defined by taking into consideration functions of the present disclosure, which may be changed according to the intentions and practices of users or operators. Accordingly, the terms should be determined based on the entire specification in the present disclosure.

Further, in order to efficiently describe technical characteristics of the present disclosure, the exemplary embodiments may suitably modify, integrate, or divide terms that can be commonly comprehended by those skilled in the art. However, the present disclosure is not limited thereby.

Hereinafter, exemplary embodiments will be described in more detail with reference to accompanying drawings.

Figure 1:
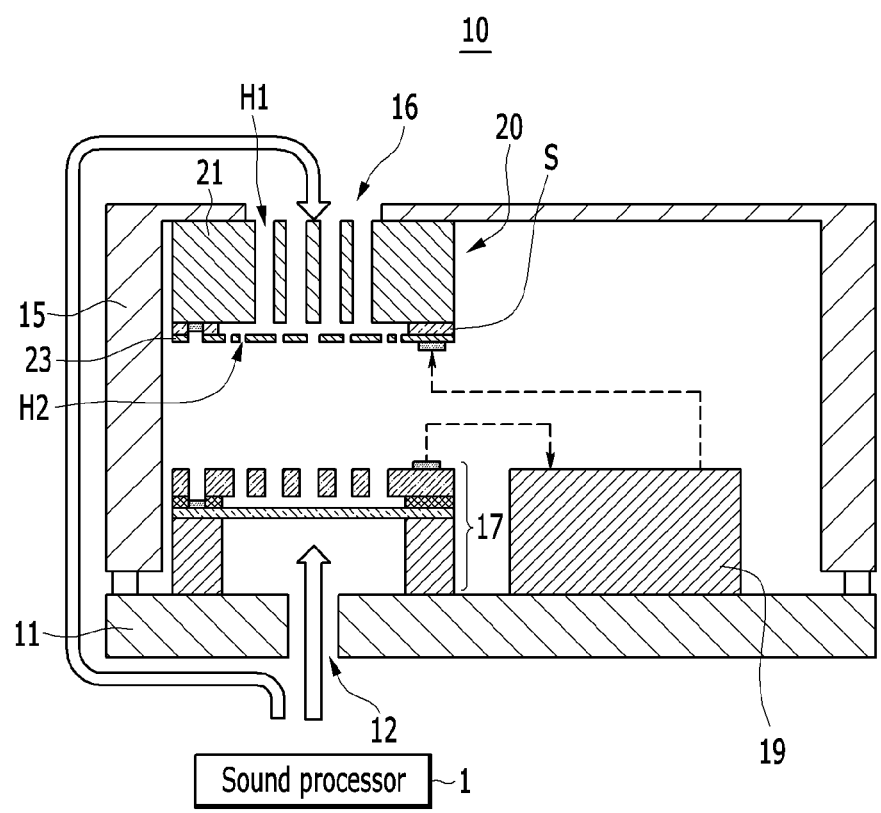
FIG. 1 is a schematic diagram illustrating a microphone according to a first exemplary embodiment of the present invention.

FIG. 1 is a schematic diagram illustrating a microphone according to a first exemplary embodiment of the present invention. Referring to FIG. 1, the microphone 10 according to the first exemplary embodiment of the present invention includes a main substrate 11, a cover 15, a sound sensing module 17, a sound delay filter 20, and a semiconductor chip 19.

The main substrate 11 includes a first sound aperture 12, and may be configured by a Printed Circuit Board (PCB) substrate.

In this case, the first sound aperture 12 serves as a path to receive a sound source generated from a sound processor 1.

The sound processor 1 processes a sound of a user, and may include at least one of a sound recognition device, a hands free device, and a portable communication terminal.

The sound recognition device can recognize and perform a command from the user when the user sends a command with a sound.

The hands free device can connect to a portable communication terminal through near distance wireless communication so that the user may freely make a call without holding the portable communication terminal.

The portable communication terminal may make a call in a wireless scheme, and may include a smart phone and a private portable information terminal (e.g., a Personal Digital Assistant (PDA)).

The cover 15 is mounted on the main substrate 11. The cover 15 includes a second sound aperture 16 corresponding to the first sound aperture 12. The second sound aperture 16 serves as a path in which a sound source generated from the sound processor 1 is introduced as in the first sound aperture 12. The cover 15 may be made of a metal material.

The sound sensing module 17 is located on the main substrate 11, and is connected to the first sound aperture 12. The sound sensing module 17 may sense a sound source generated from the sound processor 1, for example, by using a vibration membrane and a fixing membrane. In addition, the sound sensing module 17 can output a sensing signal to the semiconductor chip 19.

The sound sensing module 17 may be configured by a non-directional microphone. In this case, the non-directional microphone may include a microphone based on MEMS technology.

The sound delay filter 20 can be disposed at an upper portion of the sound sensing module 17. The sound delay filter 20 can be connected to the second sound aperture 16 which is formed in the cover 15. The sound delay filter 20 may include a filter substrate 21 and a drive layer 23. The filter substrate 21 may include a set of first penetration apertures H1, and may be made of at least one of a silicon wafer and a silicon-on-insulator (SOI) wafer.

The drive layer 23 can be spaced apart by a sacrificial layer S on the filter substrate 21, and may include a set of second penetration apertures H2. In this case, the set of first penetration apertures H1 and the set of second penetration apertures H2 may be offset from each other.

In addition, when a current from a semiconductor chip 19 (described below) is applied to the drive layer 23, the drive layer 23 makes contact with a substrate to change a directional characteristic. The drive layer 23 may be made of one of silicon and polysilicon.

The semiconductor chip 19 can be electrically connected to the sound sensing module 17. The semiconductor chip 19 selectively operates the sound delay filter 20 according to a signal output from the sound sensing module 17. In more detail, the semiconductor chip 19 receives a sound source voltage from sound sensing module 17, and measures amplitude of a noise voltage with respect to the sound source voltage.

Next, the semiconductor chip 19 determines whether the amplitude of the noise voltage is equal to or greater than an amplitude of a preset reference voltage to generate a determination result. In this case, the reference voltage may represent an intensity of a sound with which the user may easily call and perform sound recognition. The reference voltage may be set by the user or may be set by a previously designated algorithm (e.g., a program and probability model). The reference voltage may not be fixed, but may change according to the situation. The semiconductor chip 19 may include an Application Specific Integrated Circuit (ASIC).

A method of manufacturing the microphone 10 as described above can be as follows. First, a sound sensing module 17 can be formed on a main substrate 11 including a first sound aperture 12 to be connected with the first sound aperture 12. In this case, the first sound aperture 12 receives a sound source generated from an external sound processor 1 to transfer the sound source to the sound sensing module 17. Next, a cover 15 can be formed on the main substrate 11. The cover 15 can be formed therein with a second sound aperture 16 corresponding to the first sound aperture 12.

The second sound aperture 16 can receive the sound source generated from the external sound processor 1 as in the first sound aperture 12. Next, a sound delay filter 20 can be formed to be connected to the second sound aperture 16. Hereinafter, a method of manufacturing the sound delay filter 20 is described.

Figure 2:
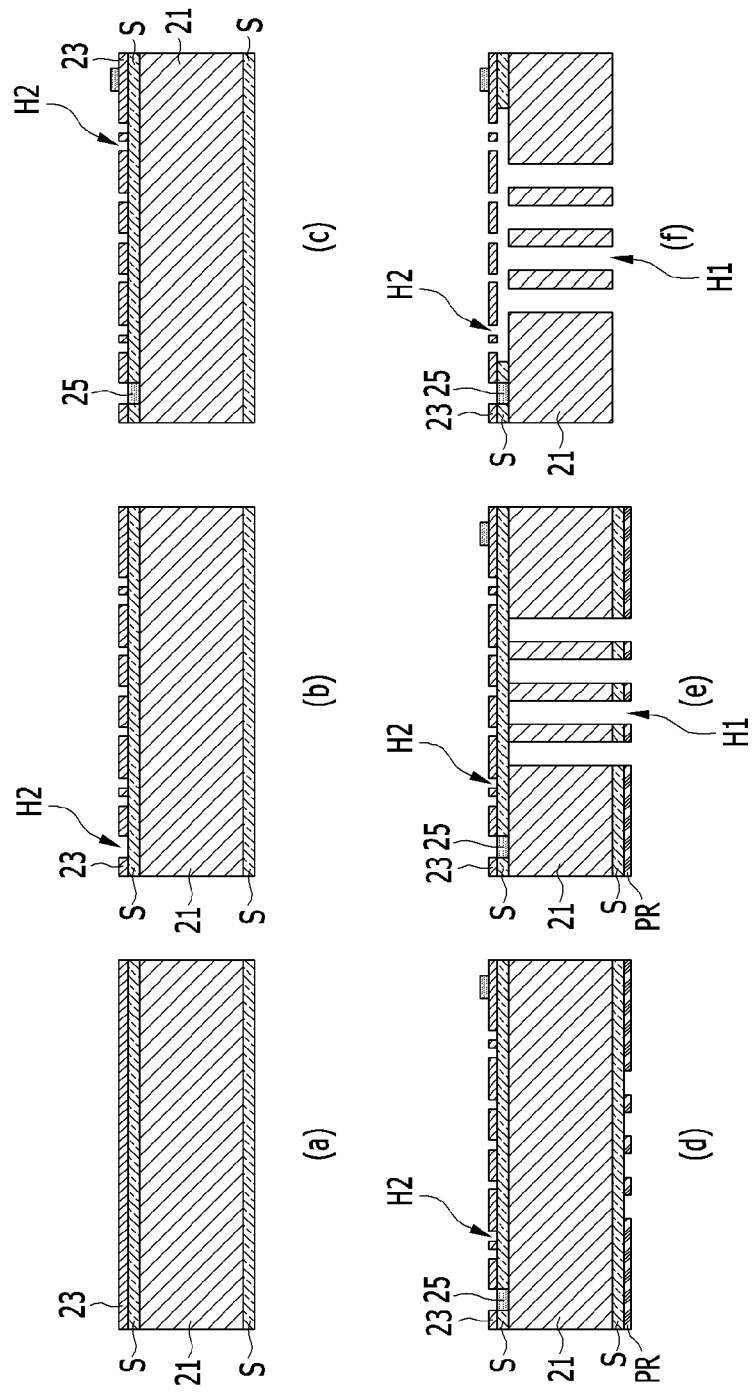
FIG. 2 is a diagram illustrating a method of manufacturing a sound delay filter of a microphone according to an exemplary embodiment of the present invention.

FIG. 2 is a diagram illustrating a method of manufacturing a sound delay filter of the microphone according to an exemplary embodiment of the present invention. Referring to FIG. 2, in the method of manufacturing a sound delay filter 20 of the microphone, a filter substrate 21 is firstly prepared. The filter substrate 21 may be made of a silicon wafer. Next, as illustrated in FIG. 2 (a), sacrificial layers S can be formed on a top surface and a bottom surface of the filter substrate 21, respectively, and a drive layer 23 can be formed on the sacrificial layer S of the top surface. Subsequently, the photoresist layer PR can be formed on the drive layer 23. A photoresist pattern is formed by patterning the photoresist PR, and as shown in FIG. 2 (b), the drive layer 23 is etched by using the photoresist pattern S as a mask so that a set of first penetration apertures H1 are formed. In this case, the drive layer 23 may be made of one of polysilicon and SOI.

Subsequently, as illustrated in FIG. 2 (c), a metal electrode 25 can be formed on the etched drive layer 23. In this case, the metal electrode 25 can be connected to both the drive layer 23 and a substrate in order to confirm capacitance. Next, as shown in FIG. 2 (d), a photoresist layer PR can be formed in the sacrificial layer S of a bottom surface of the filter substrate 21. After that, a photoresist pattern is formed by patterning the photoresist layer PR, by using the photoresist pattern as a mask, and as shown in FIG. 2 (e), the filter substrate 21 is etched so that a plurality of second penetration apertures H2 are formed.

In this case, the first penetration apertures H1 and the second penetration aperture H2 are offset from each other.

In this case, the first penetration aperture H1 is selectively closed and opened by the drive layer so that a directional characteristic is implemented.

Next, as illustrated in FIG. 2 (f), a part of the sacrificial layer S of a top surface of the filter substrate 21 and a sacrificial layer S of a bottom surface are removed.

Due to this, according to a part of the sacrificial layer S remaining at the top surface, the drive layer 23 is spaced apart from the filter substrate 21 by a predetermined distance.

The sound delay filter 20 according to an exemplary embodiment of the present invention manufactured as described above can rotate in upward and downward directions, and is mounted to be connected to the second penetration aperture H2.

Meanwhile, after forming the sound delay filter 20, a semiconductor chip 19 is formed to be electrically connected to the sound sensing module 17. The semiconductor chip 19 selectively operates the sound delay filter 20 according to a signal output from the sound sensing module 17. The semiconductor chip 19 may include an Application Specific Integrated Circuit (ASIC).

Figure 3:
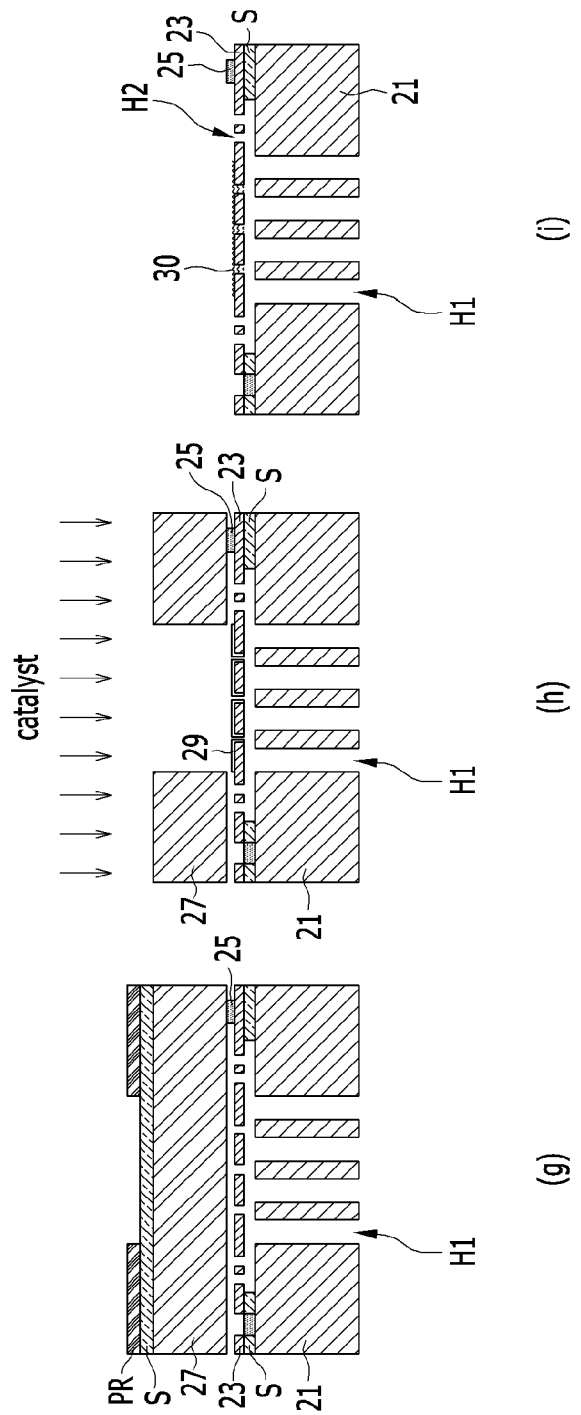
FIG. 3 is a diagram illustrating a method of manufacturing a sound delay filter of a microphone according to another exemplary embodiment of the present invention.

FIG. 3 is a diagram illustrating a method of manufacturing a sound delay filter of the microphone according to another exemplary embodiment of the present invention. Referring to FIG. 3, using the manufacturing method of FIG. 2, as shown in FIG. 3 (g), a catalyst substrate 27 is disposed on the drive layer 23. In this case, the catalyst substrate 27 may be made of a silicon material.

After a sacrificial layer S and a photoresist layer PR are formed on the catalyst substrate 27 and a photoresist pattern is formed by patterning the photoresist layer PR, the catalyst substrate 27 is etched by using the photoresist pattern S as a mask. By using the etched catalyst substrate 27 as the mask, as shown in FIG. 3 (h), a catalyst 29 is deposited on the drive layer 23. The catalyst 29 may include iron (Fe). The catalyst 29 is deposited at only the drive layer 23 which is exposed to an etched part of the catalyst substrate 27.

In more detail, the catalyst 29 is deposited between a set of first penetration apertures H1 of the drive layer 23 exposed by an etched part of the catalyst substrate 27 as well as a top surface of the drive layer 23 exposed by the etched part of the catalyst substrate 27. As shown in FIG. 3 (i), a bonding material 30 is bonded to the catalyst 29 deposited to the drive layer 23. The bonding material 30 may include carbon nanotubes (CNT).

In the same manner as the method of FIG. 2, the sound delay filter 20 according to the exemplary embodiment of the present invention formed as described above can be rotated in upward and downward directions and is mounted to be connected to the second penetration aperture H2.

Figure 4:
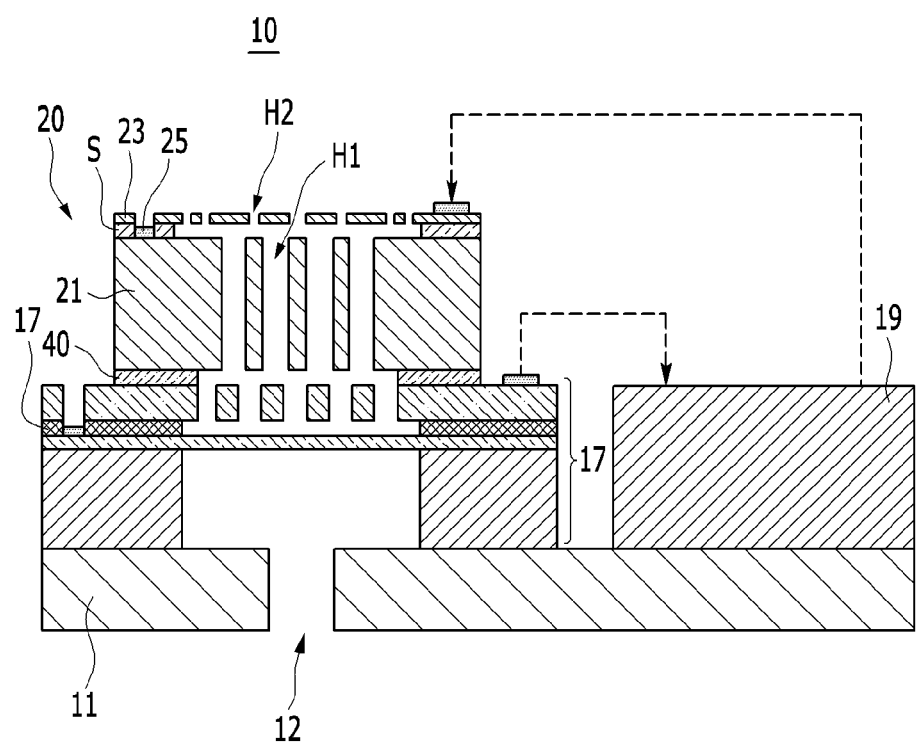
FIG. 4 is a schematic diagram illustrating a microphone according to a second exemplary embodiment of the present invention.

FIG. 4 is a schematic diagram illustrating a microphone according to a second exemplary embodiment of the present invention. Referring to FIG. 4, based on FIG. 1, a position of the sound delay filter 20 may be changed. Further, by removing a cover of FIG. 1, manufacture is possible by a simple process. In more detail, the sound sensing module 17 can be mounted at one surface of the main substrate 11 formed therein with the first sound aperture 12 to be connected to the sound sensing module 17.

A sound delay filter 20 can be mounted on the sound sensing module 17 through a conjugated pad 40. In this case, the conjugated pad 40 is for the purpose of eutectic bonding. The eutectic bonding is bonding in which surfaces are easily melted and stuck to each other in the lowest melting point when constituent elements of an alloy satisfy conditions such as a predetermined component ratio and a predetermined temperature.

That is, in order to bond the sound sensing module 17 to the sound delay filter 20, the conjugated pad 40 made by metal can be attached, and the sound sensing module 17 may be bonded to the sound delay filter 20 through the conjugated pad 40 through eutectic bonding.

Since a configuration and a manufacturing method of the microphone 10 according to the second exemplary embodiment of the present invention are the same as a configuration and a manufacturing method shown in FIG. 1, a detailed description thereof is omitted.

Figure 5:
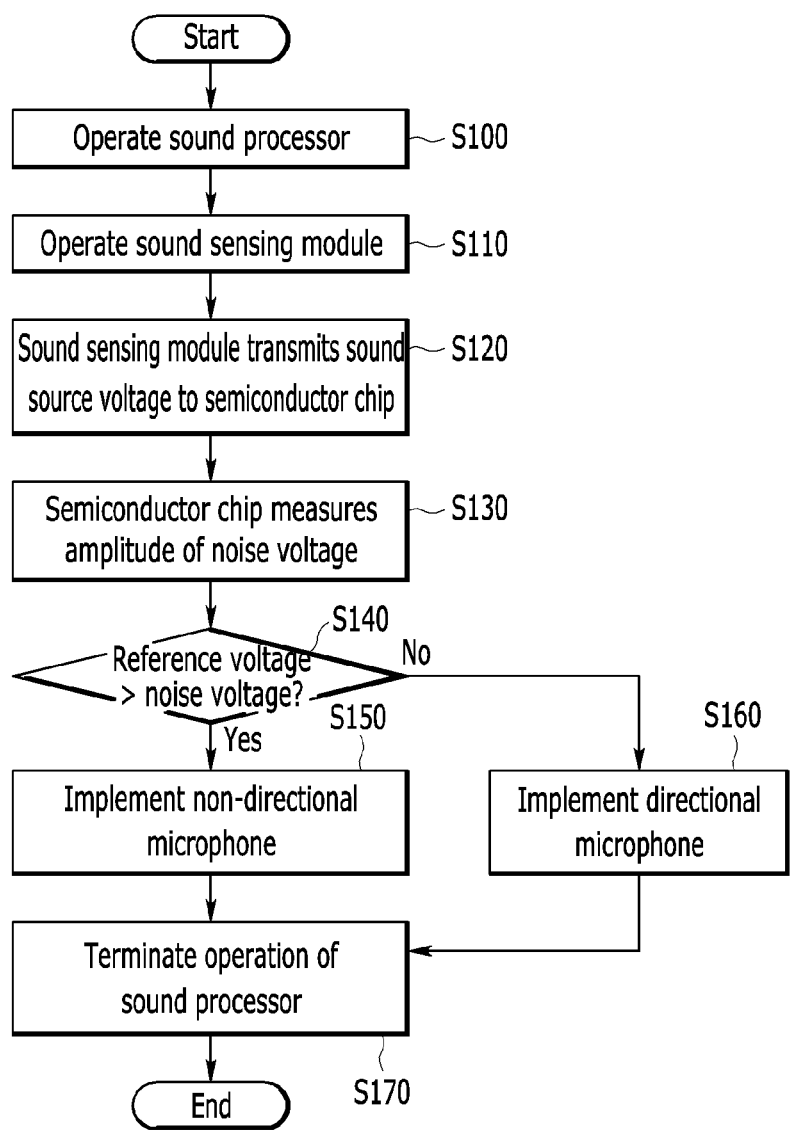
FIG. 5 is a flowchart illustrating a control method of a microphone according to an exemplary embodiment of the present invention.

FIG. 5 is a flowchart illustrating a control method of a microphone according to an exemplary embodiment of the present invention.

Referring to FIG. 5, at step S100 a sound processor 1 may start an operation, for example, by processing a sound of a user. The sound processor 1 may include at least one of a sound recognition device, a hands free device, and a portable communication terminal.

When the sound processor 1 starts the operation, the sound sensing module 17 is also operated, per step S110. The sound sensing module 17 transmits a sound source voltage input from the sound processor 1 to a At step S130, the semiconductor chip 19 measures amplitude of a noise voltage with respect to the sound source voltage from the sound sensing module 17. The semiconductor chip 19 compares the noise voltage with a preset reference voltage, at step S140.

When the noise voltage is less than the reference voltage, at step S150 the semiconductor chip 19 applies a current to the sound delay filter 20 so that a drive layer 23 can make contact with the filter substrate 21 to close the first penetration aperture H1, and to implement the microphone 10 as a non-directional microphone.

When the noise voltage is equal to or greater than the reference voltage, at step S160, the semiconductor chip 19 blocks the supply of the current to the sound delay filter 20, so that the drive layer 23 does not make contact with the filter substrate 21 to open the first penetration aperture H1, and to implement the microphone 10 as a directional microphone. Finally, at step S170 the sound processor 1 is terminated.

Figure 6:
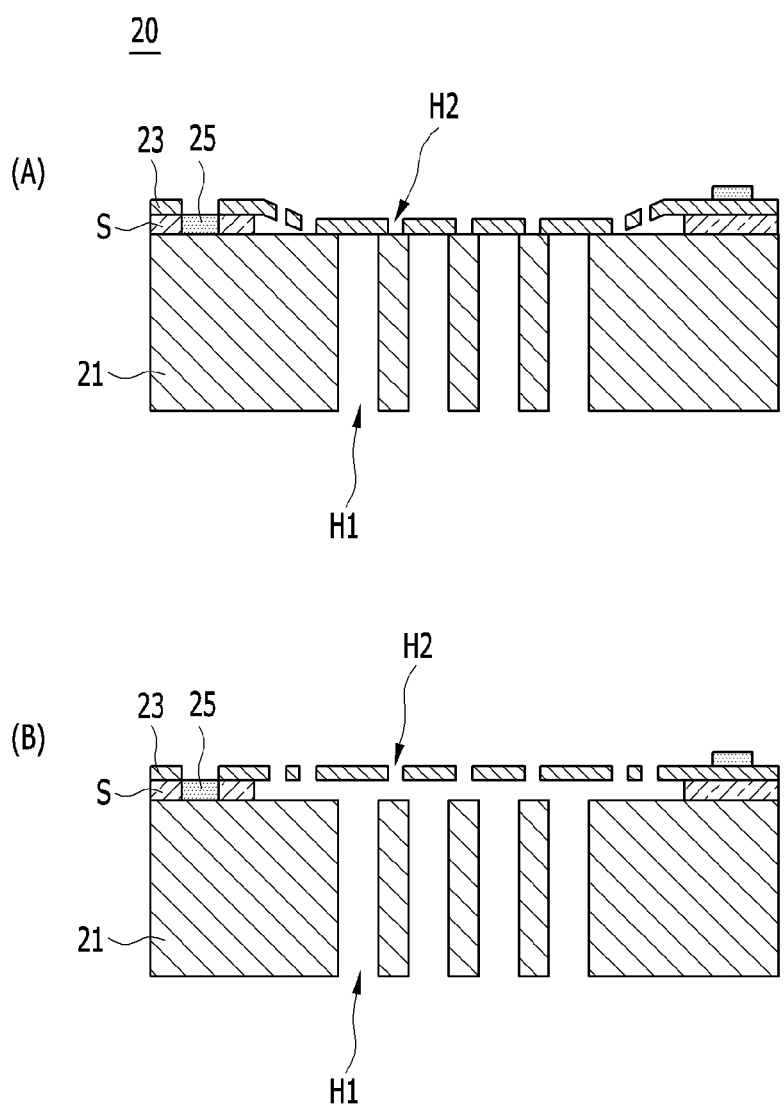
FIG. 6 is a schematic diagram illustrating an operation of a sound delay filter of a microphone according to an exemplary embodiment of the present invention.

An operation of the sound delay filter 20 is described with reference to FIG. 6. FIG. 6 is a schematic diagram illustrating an operation of a sound delay filter of the microphone according to an exemplary embodiment of the present invention.

Referring to FIG. 6, the sound delay filter 20 selectively implements directional or non-directional characteristic according to the determination signal from the semiconductor chip 19. The semiconductor chip 19 compares a noise voltage from the sound sensing module 17 with a preset reference voltage.

When the noise voltage is less than the reference voltage, the semiconductor chip 19 applies a current to the sound delay filter 20 so that the drive layer 23 makes contact with the filter substrate 21 as illustrated in FIG. 6 (A).

In this case, since the first penetration aperture H1 formed at the drive layer 23 and the second penetration aperture H2 formed at the filter substrate 21 are offset from each other, the first penetration aperture H1 and the second penetration aperture H2 are closed. Due to this, the microphone 10 is implemented as a non-directional microphone.

Meanwhile, the semiconductor chip 19 compares a noise voltage input from the sound sensing module 17 with a preset reference voltage. When the noise voltage is equal to or greater than the reference voltage, the semiconductor chip 19 blocks the supply of the current to the sound delay filter 20, so that the drive layer 23 is spaced apart from the filter substrate 21 in an original state as illustrated in FIG. 6 (B). That is, the drive layer 23 is returned to the original state. In this case, the sound delay filter 20 opens the first penetration aperture H1 formed at the drive layer 23 and the second penetration aperture H2 formed at the filter substrate 21 so that the microphone 10 is implemented as a directional microphone.

Accordingly, since the microphone 10 according to an exemplary embodiment of the present invention may selectively operate non-directional and directional characteristics, and is operated according to electrostatic force, power consumption and cost is reduced.

An exemplary embodiment of the present invention is disclosed herein. While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A method of manufacturing a microphone, the method comprising:

forming a sound sensing module on a main substrate including a first sound aperture, such that the sound sensing module is connected to the first sound aperture;

forming a cover for receiving the sound sensing module, with a second sound aperture formed at the cover corresponding to the first sound aperture and mounted on the main substrate;

forming a sound delay filter at a receiving space of the cover to be connected to the second sound aperture; and forming a semiconductor chip electrically connected to the sound sensing module at the receiving space and selectively operating the sound delay filter according to a signal output from the sound sensing module.

2. The method of claim 1, wherein the forming of the sound delay filter comprises:

forming sacrificial layers on a top surface and a bottom surface of a filter substrate, respectively;

forming a drive layer on the sacrificial layer on the top surface of the filter substrate;

forming a plurality of first penetration apertures by etching the drive layer;

forming a metal electrode at the etched drive layer;

forming a photoresist layer on the sacrificial layer of the bottom surface of the filter substrate;

forming a photoresist pattern by patterning the photoresist layer;

forming a plurality of second penetration apertures by etching the substrate by using the photoresist pattern as a mask; and disposing the drive layer and the filter substrate to be spaced apart from each other by etching the sacrificial layers on a top surface and a bottom surface of a filter substrate.

3. The method of claim 2, further comprising:

upon disposing the drive layer and the filter substrate to be spaced apart from each other:

disposing a catalyst substrate on the drive layer;

forming a sacrificial layer and a photoresist pattern on the catalyst substrate;

etching the catalyst substrate by using the photoresist pattern as a mask;

depositing a catalyst on the drive layer by using the etched catalyst substrate as a mask; and bonding a bonding material to the catalyst deposited to the drive layer.

4. The method of claim 3, wherein the bonding material is made from carbon nanotubes (CNT).

5. A microphone comprising:

a sound sensing module mounted on a surface of a main substrate with a first sound aperture formed at the main substrate, such that the sound sensing module is connected to the first sound aperture;

a cover for receiving the sound sensing module with a second sound aperture formed at the cover corresponding to the first sound aperture and mounted on the main substrate;

a sound delay filter formed at a receiving space of the cover to be connected to the second sound aperture; and a semiconductor chip electrically connected to the sound sensing module at the receiving space and selectively operating the sound delay filter according to a signal output from the sound sensing module.

6. The microphone of claim 5, wherein the sound delay filter comprises:

a filter substrate including a first plurality of penetration apertures; and a drive layer formed on the filter substrate to be spaced apart by a sacrificial layer, and including a second plurality of penetration apertures.

7. The microphone of claim 6, wherein the first plurality of penetration apertures and the second plurality of penetration apertures are offset from each other, and the first plurality of penetration apertures are selectively closed by the drive layer.

8. The microphone of claim 7, wherein the drive layer makes contact with the filter substrate to close the first plurality of penetration apertures when a current from the semiconductor is applied to the drive layer.

9. The microphone of claim 5, wherein the filter substrate is made of at least one of a silicon wafer and a silicon-on-insulator (SOI) wafer.

10. The microphone of claim 5, wherein the drive layer is made of at least one of silicon and polysilicon.

11. An operating method of a microphone, comprising:
operating a sound sensing module by operating a sound processor;
transmitting a sound source voltage generated from the sound sensing module to a semiconductor chip;
measuring amplitude of a noise voltage with respect to the sound source voltage input to the semiconductor chip to compare the measured noise voltage with a reference voltage preset in the semiconductor chip;
applying a current to a sound delay filter when the noise voltage is less than the reference voltage, so that a drive layer makes contact with a filter substrate to close a first plurality of penetration apertures, and to implement the microphone as a non-directional microphone.

12. The operating method of claim 11, further comprising, upon the comparing of the measured noise voltage with the reference voltage preset in the semiconductor chip,
blocking supply of the current to the sound delay filter when the noise voltage is equal to or greater than the reference voltage, so that the drive layer is spaced apart from the filter substrate by a predetermined distance to open the first plurality of penetration apertures and to implement the microphone as a directional microphone.

13. The operating method of claim 11, wherein the sound processor comprises at least one of a sound recognition device, a hands free device, and a portable communication terminal.

\* \* \* \* \*